United States Patent [19]

Nesler

[11] Patent Number: 4,553,082
[45] Date of Patent: Nov. 12, 1985

[54] TRANSFORMERLESS DRIVE CIRCUIT FOR FIELD-EFFECT TRANSISTORS

[75] Inventor: John J. Nesler, Los Angeles, Calif.

[73] Assignee: Hughes Aircraft Company, El Segundo, Calif.

[21] Appl. No.: 614,079

[22] Filed: May 25, 1984

[51] Int. Cl.$^4$ .............................................. G05F 1/56
[52] U.S. Cl. .................................. 323/288; 323/282; 307/270
[58] Field of Search ............... 219/282, 284, 285, 287, 219/288, 289; 307/270, 240, 246, 296 A

[56] References Cited

U.S. PATENT DOCUMENTS

| 4,216,393 | 8/1980 | Gillberg et al. | 307/270 |
| 4,395,675 | 7/1983 | Toumani | 323/282 X |
| 4,430,608 | 2/1984 | Nesler | 323/289 X |
| 4,521,725 | 6/1985 | Phaneuf | 323/282 |

OTHER PUBLICATIONS

International Rectifier, HEXFET Databook, Power MOSFET Application and Product Data, 1982–1983, Chapter 14, Application Note 950.

Primary Examiner—Philip H. Leung
Attorney, Agent, or Firm—M. J. Meltzer; A. W. Karambelas

[57] ABSTRACT

A transformerless drive circuit for operation of a switch mode regulator includes a turn-on circuit and a turn-off circuit coupled to a control terminal of the switch, respectively, for inducing a state of conduction in the switch and for terminating the state of conduction. The switch is, in the preferred embodiment, a P-channel DMOS field-effect transistor (FET) with a source electrode connected to the positive voltage terminal of a power supply, and with the drain terminal connected to load circuitry of the regulator. The gate electrode serves as the control terminal. The regulator includes a sensor of output voltage and circuitry for providing a pulse-width modulated control signal for designating the average amount of current to be passed by the switch. The turn-on circuit and the turn-off circuit share a common diode which operates alternately for conduction or turn-off. The turn-off circuit includes a bootstrap capacitor for momentarily powering the circuit for saturating a transistor therein, the relatively low saturation voltage being impressed at the control terminal for rapid turn-off. The drawing of current by the turn-on circuit pulls a gate-voltage away from the power line for rapid turn-on.

10 Claims, 2 Drawing Figures

TRANSFORMERLESS DRIVE CIRCUIT FOR FIELD-EFFECT TRANSISTORS

The Government of the United States of America has rights in this invention pursuant to Contract No. DAAK10-81-C-0093 awarded by the Department of the Army.

BACKGROUND OF THE INVENTION

This invention relates to a drive circuit for the operation of electronic power switches and power supplies employing switching regulators and, more particularly, to the driving of such a switch wherein the switch comprises a MOS field effect transistor (FET).

DMOS power MOSFETs are relatively new electronic components which have become commercially available from a number of manufacturers in the United States including Motorola, Unitrode, and International Rectifier Corporation. Such MOSFETs differ from PNP bi-polar transistors in that a larger voltage between gate and source is required to initiate conduction of current than the corresponding voltage between base and emitter of the bi-polar transistor. Of particular interest is the design of switching regulators with respect to the increased speed of turn-off, or termination of current conduction, in the MOSFET. The MOSFET can be switched off in approximately 0.1 microseconds or less as compared to 2 microseconds for a bipolar transistor of comparable power rating.

One form of switching regulator is known as a buck switching regulator. In such a regulator, the power switch transistor floats at the line voltage of the regulator. Sensing circuitry in the regulator is at ground potential. The sensing circuitry senses the output voltage of the regulator and provides a pulse-width modulated control signal wherein the duty factor determines the average value of the current to be conducted by the power switch to the regulator output.

A problem arises in the coupling of the control signal to the switch transistor due to the fact that the control signal must be coupled from the sensing circuit, at ground potential, to the switch which floats at the line potential. Heretofore, PNP bi-polar transistors have often been used as part of the power switching element. Transformers and optical couplers have been often used for coupling the control signal to the power switch transistor. Optical couplers are disadvantageous in that their operation is limited to lower power levels requiring additional post amplification. Also, the frequency response of the optical couplers is significantly lower than that of the power MOSFETs so that a major advantage in the use of the MOSFET is depressed.

The aforementioned problems associated with coupling a control signal from the sensing circuit at ground potential, to the switch, which floats at line potential have led others to use transformers or photocouplers to translate the input drive signal from ground reference to line reference. The circuit shown in Application Note 950 from the 1982-83 Hexfet Databook (published by International Rectifier) is a good example of the prior art approach. A saturable core coupling transformer is used in this prior art circuit. The instant invention solves the ground translation problem without using transformers or opto-couplers and thus eliminates the drawbacks associated with these components. The transformerless coupling circuit of the instant invention offers better high frequency noise immunity than the transformer type circuits of the prior art.

Transformers also introduce limitations in the operating characteristics of the regulator in that they cannot effectively couple the control signal in the cases of very low and very high duty cycles. A further disadvantage of the transformers found in the production line is that transformers from different manufacturers tend to differ in their characteristics due to limitations in the comprehensiveness of specifications. Thus, the resulting characteristics of the regulator differ depending on the source of the transformer and dependence on unspecified transformer parameters. Comprehensive specifications which would reduce variations between transformers would cause a significant increase in cost.

SUMMARY OF THE INVENTION

The foregoing problems are overcome and other advantages are provided by a switch-mode regulator incorporating a floating power switch. This switch includes a P-channel DMOS field-effect transistor (FET) and a driver circuit incorporating the invention for directly coupling a control signal from the feedback sensing circuitry to a control terminal of the power switch without the use of a coupling transformer. The source electrode of the MOSFET of the power switch is connected to the high voltage line, the gate electrode serves as the control terminal, and the drain electrode is connected to the output section of the regulator. For maximum frequency response, a current pulse is applied to the control terminal for turning on the switch to initiate conduction while a second pulse is applied for turning off the switch to terminate the conduction. The current pulses have sufficient amplitude to discharge any stray capacitance associated with the control terminal as well as any control charges within the MOSFET for maximum speed of turn-on and turn-off.

It is, therefore, an object of the invention to provide separate drive circuits for turn-on and turn-off of the power switch transistor.

The invention makes use of a feature of the MOSFET wherein its saturation voltage, between the source and the drain electrodes, is less than the amount of voltage, which is required between the gate and the source electrodes to produce a low voltage drop state of conduction between source and drain.

The first current pulse is generated by a transistor turn-on circuit having a collector terminal connected to the gate terminal of the MOSFET power switch. A resistor is in series with the gate source junction to limit MOSFET current drive and a diode clamp is in parallel with the gate source circuit to inhibit excessive voltage drive.

The second current pulse is produced by a floating turn-off circuit with a transistor and a bootstrap capacitor circuit which stores energy for powering the transistor. A diode is common to both the turn-on and turn-off circuits and, during a turn-on or conduction interval, deactivates the turn-off circuit. The diode thereby serves to switch on the turn-off circuit at the conclusion of the conduction interval.

The turn-off circuit is active for a very short interval of time, the time being shorter than any pulse of the pulse-width modulated control signal. During this time the bootstrap capacitor powers the transistor until discharge of the capacitor. The bootstrap circuit places the transistor of the turn-off circuit in saturation. This transistor is also a MOSFET, but of N-channel construction, and has its source and drain terminals coupled between the line voltage and the control terminal of the power switch. Upon saturation of the turn-off MOSFET, the gate-to-source voltage of the power switch MOSFET is driven rapidly below the conduction level allowing rapid turn-off.

Thereby, the transistor of the turn-on circuit rapidly pulls the voltage of the gate electrode of the power MOSFET away from the source which is connected to the line voltage, thus providing fast turn-on. The saturation of the transistor of the turn-off circuit rapidly returns the voltage of the gate electrode of the power MOSFET toward the source for fast turn-off.

BRIEF DESCRIPTION OF THE DRAWING

The aforementioned aspects and other features of the invention are explained in the following description taken in connection with the accompanying drawing wherein.

DETAILED DESCRIPTION OF THE INVENTION

Figure 1:
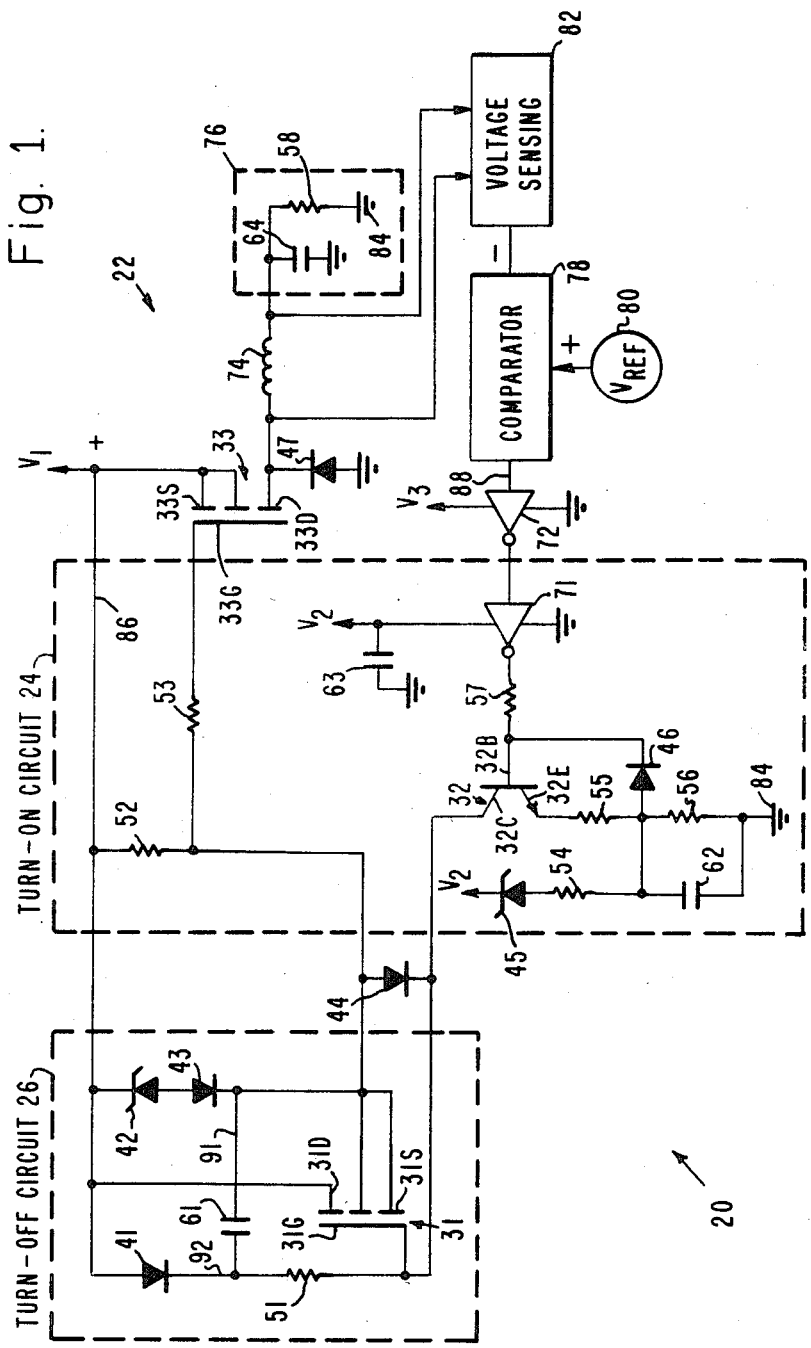
FIG. 1 is an electrical schematic diagram of the invention.

FIG. 1 shows a drive circuit incorporating the invention for use with a regulator 22 wherein the components are arranged in a conventional configuration. The drive circuit 20 comprises a turn-on circuit 24 and a turn-off circuit 26. FIG. 1 also shows three transistors, 31–33, located, respectively, on the turn-off circuit 26, the turn-on circuit 24 and the regulator 22. The transistor 31 is a MOSFET of N-channel construction and has a drain electrode 31S. The transistor 32 has a collector terminal 32C, a base electrode 32B and an emitter electrode 32E. The transistor 33 is a MOSFET with P-channel construction and has a source electrode 33S, a gate electrode 33G, and a drain electrode 33D.

The circuit of FIG. 1 further comprises seven diodes, 41–47, of which the diodes 42 and 45 are Zener diodes; eight resistors, 51–58; four capacitors, 61–64; and two digital inverters, 71–72.

The regulator 22 comprises the foregoing transistor 33, the diode 47 and the inverter 72, and further comprises an inductor 74 coupled to a load 76 which comprises the capacitor 64 and the resistor 58. Also included within the regulator 22 are a comparator 78 coupled to a source 80 of reference voltage and a voltage sensor 82.

In operation, the regulator 22 produces pulses of current through the transistor 33, this transistor serving as a power switch of which the current is switched from the line-voltage terminal V1 of the regulator 22 via the load 76 into ground 84.

The regulator 22 serves as a regulated power supply for supplying power at a predetermined amount of voltage to the load 76. By way of example, the load 76 is shown with a resistive component, represented by the resistor 58, and may also have a capacitive component, as represented by the capacitor 64. The pulses of current are smoothed by the inductor 74. The source electrode 33S connects with the line voltage V1 on line 86, and the drain electrode 33D connects with the junction of the inductor 74 and the diode 47.

The polarity of the diode 47 is selected to permit the flow of current to continue through the inductor 74 via the diode 47 and ground upon the termination of a current pulse at the transistor 33. This permits an inductive kickback current to continue to flow in the inductor 74. The voltage applied to the load 76 is sensed by the sensor 82 which, in response to the magnitude of the voltage, applies a signal to the comparator 78. The comparator 78, which is sometimes referred to as a hysteresis comparator, compares the output voltage with the reference voltage of the source 80 to provide an output signal on line 88 which is depicted in the first graph of FIG. 2.

Figure 2:
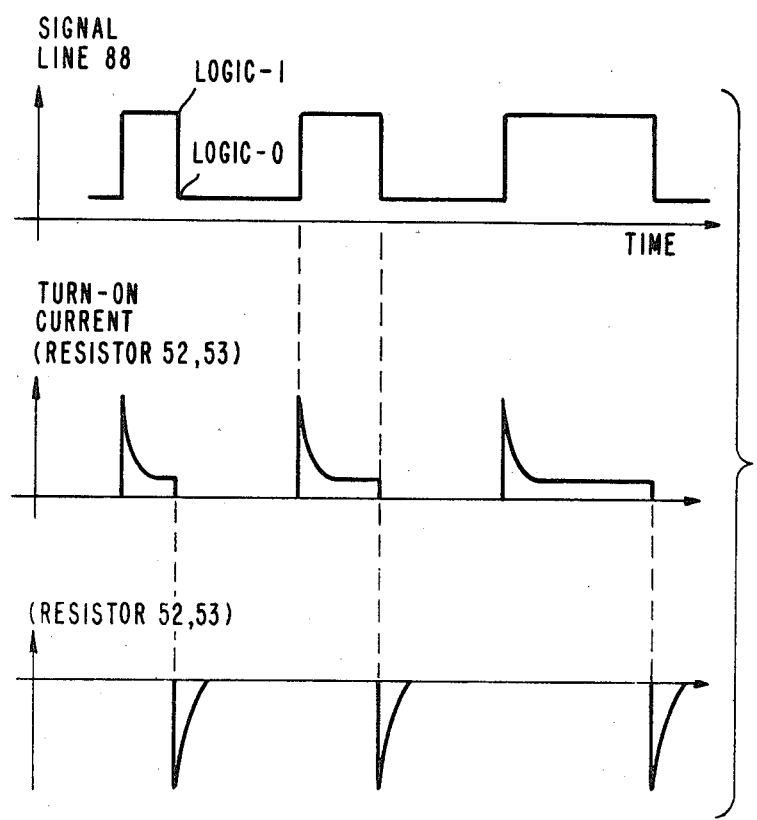
FIG. 2 is a timing diagram useful in explaining the invention.

With reference also to FIG. 2 the waveforms depicted in the graphs are in time registration with each other so as to show the respective times of occurrences of the portions of the respective waveforms. The signal depicted in the first graph, this being the signal on line 88 in FIG. 1, is applied as a control signal to the drive circuit 20.

The signal assumes either one of two states, a logic-0 or a logic-1. The logic-1 signal appears when the voltage sensed by the sensor 82 drops below the reference voltage 80 and, therefore, indicates that the power switch, namely the transistor 33, is to be placed in a state of conduction for admitting more current via the inductor 74 to the load 76. When the sensed voltage rises above a preset level, the comparator 78 outputs a logic-0 signal on line 88 for termination of the state of conduction in the transistor 33. Thereby, the regulator 22 and the drive circuit 20 function in the manner of a feed back loop wherein the control signal on line 88 directs the circuit 20 to drive the transistor 33 on or off.

The on time, logic-1 state, varies in duration depending on the need for current at the load 76. Thus, the control signal on line 88 is in the form of a pulse-width modulated signal wherein the duty factor is proportional to the voltage delivered to the load 76 and inversely proportional to the input voltage V1.

In the construction of a preferred embodiment of the invention, the line voltage V1 is 28 volts positive with respect to ground. V2 is 10.3 volts positive with respect to ground, and V3 is 5 volts positive with respect to ground. The transistor 31 is type MFE930 manufactured by Motorola, transistor 32 is type 2N3019, and the transistor 33 is type IRF9130 manufactured by International Rectifier Corporation.

During a state of conduction in the transistor 32, current flows from line 86 via the resistor 52, the diode 44, the transistor 32, the resistor 55 and the resistor 56 to ground. The control current enters the transistor 33 at the source terminal 33S of transistor 33 through the gate terminal 33G through diode 44 and resistor 53 to the collector terminal 32C and exits the transistor 32 at the emitter terminal 32E. A voltage drop appears across the resistor 52 due to the current flowing therein, the voltage drop being communicated by the resistor 53 to the gate terminal 33G of the transistor 33. The resistor 53 has a relatively low value of 3.3 ohms and is employed for inhibiting any parasitic oscillations which might develop within the transistor 33. The resistor 52 has a value of 10,000 ohms.

The resistor 52, the transistor 32 and the other elements shown within the clock of the turn-on circuit 24 are components of the turn-on circuits 24. Certain components are utilized for both the turn-on and turn-off functions. Thus, the diodes 42 and 43 of the turn-off circuit 26 also function during the turn-on function when current is flowing in the resistor 52.

The serial connection of the diodes 42 and 43 is in parallel with the resistor 52 and, accordingly, serves to clamp the voltage drop across the resistor 52 to a value of 10.7 volts. The clamping action of the diodes 42 and 43 protect the source-gate voltage drop across the transistor 33 from reaching an excessive value which might otherwise damage the transistor 33. Thus, when the foregoing current is flowing through the transistor 32, the transistor 33 is in a state of conduction for conducting current from the line 86 to the load 76.

The diode 44 also is used during the turn-on and turn-off functions. When the foregoing current flows through the resistor 52, the diode 44 and the transistor 32, the voltage across the diode 44 is a relatively small value and of such a polarity as to deactivate the turn-off circuit 26 during the state of conduction in the transistor 33. Thereby, the diode 44 operates as a switch for alternate operation in either the turn-on process or the turn-off process.

The two resistors 55 and 56, having respectively values of 18 ohms and 200 ohms, provide an emitter-follower function which insures linear operation of the transistor 32 in response to the control signal applied from line 88 via the two inverters 72 and 71. The resistor 57 has a value of 18 ohms. It is to be understood that the values of resistors are given by way of example in construction of a preferred embodiment of the invention and that departures from these values may be made for use of the invention with other values of voltage and other values of control signal.

Since the value of V2 is approximately double that of V3, the control signal has a substantially larger amplitude at the output of the inverter 71 than at line 88. The capacitor 63 connected between V2 and ground serves to filter the power applied to the inverter 71 between the terminal of V2 and ground. The resistor 57 couples the output signal of the inverter 71 to both the base electrode 32B and the diode 46, the latter acting as a clamp to protect the base-emitter junction of the transistor 32 from excessive back voltage.

The connection of the capacitor 62 in parallel with the resistor 56 provides a speed-up feature in the turn-on process. When a logic-1 signal is initially applied to the base terminal 32B, the capacitor 62 retains a constant voltage across the resistor 56 for a short interval of time with the result that there is relatively little feedback in the emitter circuit. This feedback is provided by the resistor 55. As a result, the transistor 32 draws far more current in response to the logic-1 signal than is the case after the capacitor 62 has charaged up to the highter voltage level associated with the residual state of conduction in the transistor 32.

The resultant turn-on current, for turning on the transistor 33, is depicted in the second graph of FIG. 2, the portrayal in the second graph being somewhat stylized to emphasize the initial current peak which dies out in approximately 800 nanoseconds. The extra burst of current helps charge any stray capacitance as well as capacitance within the transistor 33. The capacitor 62 has a value of 0.047 microfarads which, in conjunction with the resistors coupled thereto, provides the time constant for the foregoing 800 nanoseconds.

Operation of the transistor 32 in its linear mode insures a rapid response time for the transistor 32 by the prevention of any build-up of space storage charge which would slow down the operation. Thereby, the operation in the linear mode in combination with the initial current peak provides for a rapid turn-on of the transistor 33. The current in the remaining portion of each pulse depicted in the second graph of FIG. 2 is sufficient to maintain the state of conduction in the transistor 33.

When the state of the control signal (line 88) changes from a logic-1 to a logic-0, the same transition in state appears at the output of the inverter 71 since the double inversion of the two inverters, 72 and 71, restores the logic state. Accordingly, during the transition from logic-1 to logic-0, the drive circuit 20 is commanded to turn-off the transistor 33, and to terminate the state of conduction therein.

At the beginning of the turn-off interval, the capacitor 62 has a relatively high value of voltage, this voltage being greater than that of the logic-0 state appearing at the output of the inverter 71. Accordingly, current flows from the capacitor 62 through the diode 46 and the resistor 57 to the output terminal of the converter 71. Thereby, the base terminal 32B is negatively biased relative to the emitter terminal 32E. The negative bias terminates the flow of current in the transistor 32. Thereafter, the voltage in the capacitor 62 decreases as the capacitor 62 discharges through the resistor 56.

As the voltage across the resistor 56 becomes lower, the Zener diode 45 begins to conduct so as to provide a steady state value of voltage across the resistor 56 based on the relative values of the resistors 54 and 56 as well as the voltage drop across the Zener diode 45. The diode 45 is type 1N746A and has a Zener voltage of 3.3 volts. The resistor 54 has a value of 510 ohms. The resulting steady state voltage drop across the resistor 56 is sufficiently large relative to that of the logic-0 voltage at the output of inverter 71 to maintain the transistor 32 in a state of non-conduction.

In order to initiate a rapid turn-off of the transistor 33, the turn-off circuit 26 is activated by the diode 44. Since the same current was flowing through both the diode 44 and the transistor 32, upon termination of this latter current, the current also terminates in the diode 44. As a result, the voltage between the source electrode 31S and the gate electrode 31G is no longer constrained to be biased for non-conduction of transistor 31 by the diode 44. The diode 44 may be regarded substantially as an open switch which allows a turn-on voltage difference to appear between the gate electrode 31G and the source electrode 31S in response to electric charge within the capacitor 61 of the turn-off circuit 26.

The capacitor 61 is charged to a value of voltage equal to the Zener voltage of the diode 42 whenever the transistor 32 is in a state of conduction. The Zener diode 42 is type 1N753A and has a Zener voltage of 10 volts. The diodes 41 and 42 are of the same type, namely 1N4150-1.

It is noted that the voltage at the junction of the capacitor 61 and the diode 43 is always equal to that at the junction of the resistors 52 and 53 in the turn-on circuit 24. Thus, during conduction in the transistor 32, the terminal 91 of the capacitor 61 is held at 10.7 volts below the voltage of the input line 86 while the terminal 92 of the capacitor 61 is held at a voltage of 10.7 volts below that of the line 86 by the diode 41.

The diode 41 is in a state of conduction when the transistor 32 conducts, the current flowing from the line 86 via the diode 41 and diode 44 into the collector electrode 32C. Due to the foregoing difference of potential between the terminals 91 and 92, the capacitor 61 charges to 10 volts during the conduction of the transistor 32, the terminal 92 being positive with respect to the terminal 91.

Upon termination of the current in the transistor 32 and upon the opening of the switch represented by the diode 44, the voltage drop in the resistor 51 is greatly reduced with the result that approximately 10 volts appear across the electrodes 31G and 31S. The resistor 51 has a value of 330 ohms and the capacitor 61 has a value of 2200 picofarads. As the capacitor terminal 91 moves up to the voltage of the line 86 upon the cessation of conduction in the transistor 32 and the commencement of conduction in transistor 31, the diode 41 becomes open circuited and the voltage of the terminal 92 rises above that of the line 86. This is the bootstrap effect. The transistor 31 is now operated in response to the power applied across the terminals 31G and 31S by by the capacitor 61. Accordingly, current flows from the line 86 into the drain terminal 31D and out of the source terminal 31S to the junction of the resistors 52 and 53. Thereby, current is now flowing in the direction which is reverse to that of the current during turn-on of the transistor 33.

The reverse current is depicted in the third graph of FIG. 2, and is seen to be a negative pulse having a duration of approximately 50 nanoseconds. During the flow of the reverse current the capacitance at the gate terminal 33G is discharged to allow for the rapid turnoff of the transistor 33.

Thereby, the turn-on circuit 24 and the turn-off circuit 26 provide rapid changes in the state of conduction of the transistor 33.

Although the preferred embodiment described above is used for positive voltage regulation, it is understood that complementary components (such as N-channel power MOSFETs) could be used to construct an equivalent circuit for the regulation of negative voltages which would be within the scope of this invention.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A drive circuit for operating an electronic switch having a control terminal for receipt of a control signal, said switch being in circuit with a device utilizing current switched by said switch, said switch being connected between a supply terminal of a source of power and said utilization device which is connected to a return terminal of said power source, said switch conducting current upon a first voltage of said control signal and terminating the current upon a second and different voltage of said control signal, said drive circuit comprising:
   a turn-on circuit coupled between said supply and said return terminals of said power source and connecting with said control terminal, said turn-on circuit including a first transistor and a switching means coupled in a series circuit between said control terminal and said return terminal of said power source, said first transistor being responsive to an input signal applied thereto initiating a first current in said series circuit to produce said first voltage of control signal, said switching means being connected between said control terminal and said first transistor;
   a turn-off circuit connected with said first switching means and being coupled in circuit with said supply terminal of said power source, said turn-off circuit comprising a second transistor in circuit with said control terminal for initiating a second current in the reverse direction of said first current to produce said second voltage of said control circuit;
   said turn-off circuit further comprising a capacitive circuit connected to said second transistor, said capacitive circuit including a capacitor for powering said second transistor subsequent to a charging of the capacitor; and
   said drive circuit further comprising means responsive to said first current for charging said capacitor; and wherein
   upon a termination of said first current in response to a change of state of said input signal, said switching means operates to permit said capacitor to apply a voltage and a current to said second transistor resulting in said second current and in saturation of said second transistor, said second current flowing via said second transistor from the supply terminal of said power supply to said control terminal of said switch, said saturation raising the voltage of the control signal to a magnitude substantially equal to that of the voltage of said power supply for turning off said electronic switch.

2. A drive circuit according to claim 1 wherein said electronic switch is a P-channel MOS field-effect transistor (FET), said supply terminal is a positive terminal, said control terminal connects with a gate of said FET, a source of said FET connecting with said positive supply terminal of said power supply, and wherein a turn-on voltage of said FET is greater than said saturation voltage to insure a termination of conduction of said electronic switch upon saturation of said circuit transistor.

3. A drive circuit according to claim 2 wherein said second transistor is an N-channel MOS FET to provide a rapid turn-off of said electronic switch.

4. A drive circuit according to claim 3 wherein said series circuit includes a resistor coupled between said control terminal and said positive supply terminal of said power supply for developing a voltage drop in response to said first and second current.

5. A drive circuit according to claim 3 wherein said switching means comprises a diode connecting said resistor with said first transistor, said first transistor being operated in a linear mode for fast turn-on and turn off, said diode providing turn-off bias to a gate terminal and a source terminal of said second transistor during conduction of said first current for disabling said turn-off circuit during operation of said turn-on circuit.

6. A drive circuit according to claim 5 wherein said turn-off circuit further comprises a diode connecting said positive terminal of said power supply with a terminal of said capacitor in a bootstrap circuit configuration wherein, upon activation of said turn-off circuit by said first-mentioned diode, said further diode permits the voltage of said capacitor terminal to rise above the voltage of said positive supply terminal of said power supply for saturation of said second transistor.

7. A drive circuit for switching a power transistor in a switch-mode power regulator wherein the power transistor is constructed in the form of a P-channel DMOS field-effect transistor (FET) and wherein, said power transistor has a source electrode connected in circuit with a positive terminal of a source of power and a drain electrode connected in circuit with a negative terminal of the source of power, said drive circuit comprising:

a turn-on circuit coupled between said positive and said negative terminals of said power source and connecting with a gate electrode of said power transistor, said turn-on circuit including a first transistor and a switching means coupled in a series circuit between said gate electrode and said negative terminal for drawing current from said gate terminal to turn on said power transistor into a state of current conduction from said source electrode to said drain electrode, said first transistor being responsive to an input signal applied between a base terminal and an emitter terminal of said first transistor for initiating said drawing of current, said switching means being coupled between said first transistor and said gate terminal;

a turn-off circuit connected with said switching means and being coupled in circuit with said positive terminal of said power source, said turn-off circuit comprising a second transistor having the form of an N-channel field-effect transistor (FET) wherein a source electrode and a gate electrode are connected across said switching means with said source electrode being connected between said switching means and said gate terminal of said power transistor, a drain terminal of said second transistor being connected in circuit with said positive terminal of said power source;

said turn-off circuit further comprising a capacitive circuit connected between the source and the gate electrodes of said second transistor;

said drive circuit further comprising means responsive to said current of said first transistor for charging a capacitor of said capacitive circuit; and wherein upon a termination of said first transistor current in response to a change in state of said input signal, said switching means opens to permit said capacitor to impress a voltage across the gate and the source electrodes of said second transistor for initiating a state of saturation in said second transistor, said state of saturation being characterized by a saturation current flowing from said positive terminal of said power source into said second transistor and a saturation voltage between the drain and the source electrodes of said second transistor; and said saturation voltage being less than the magnitude of gate-to-source voltage required for maintaining conduction in said power transistor, said saturation voltage being impressed across the gate and the source terminals of said power transistor for turning off the state of conduction in said power transistor.

8. A drive circuit according to claim 7 wherein a first terminal of said capacitor and the source of said second transistor are connected to the junction of said switching means and the gate circuit of said power transistor, the gate terminal of said second transistor being connected to a junction of said switching means and said first transistor, said gate terminal of said second transistor being further connected by a resistor to a second terminal of said capacitor, and wherein said capacitor charging means comprises a diode connected between said positive terminal of said power source and said second terminal of said capacitor, said charging circuit further comprising a clamp circuit connected between said positive terminal of said power source and said first terminal of said capacitor, said clamp circuit comprising a Zener diode circuit which serves as a portion of the current path for the current of said first transistor, said capacitor being charged to a voltage limited by said clamp circuit during the flow of the current through said first transistor.

9. A drive circuit according to claim 8 wherein said switching means comprises a third diode which acts in series with said first-mentioned diode and said capacitor during a charging of said capacitor, the current of said first transistor flowing through said third diode, said third diode substantially shorting the connection between the gate and the source electrodes of said second transistor when the current of the first transistor is flowing through the third diode, said third diode breaking the connection between the gate and the source electrodes of said second transistor when the current of said first transistor terminates to allow said capacitor to discharge through said second transistor.

10. A drive circuit according to claim 9 wherein a collector electrode of said first transistor connects with the junction of said third diode and said gate electrode of said second transistor, there being a resistor circuit coupling an emitter terminal of said first transistor to the negative terminal of said source of power to insure a linear mode of operation of said first transistor, a portion of said resistor circuit being by-passed by a capacitor for increasing the amplitude of current in said first transistor during the intitial instant of current flow, thereby to more rapidly turn-on said power transistor.

* * * * *